(12) United States Patent
Han et al.

(10) Patent No.: US 8,420,949 B2
(45) Date of Patent: Apr. 16, 2013

(54) ELECTROMAGNETIC BANDGAP STRUCTURE AND PRINTED CIRCUIT BOARD

(75) Inventors: Mi-Ja Han, Jeonju-si (KR); Dae-Hyun Park, Ulsan (KR); Han Kim, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 726 days.

(21) Appl. No.: 12/230,871

(22) Filed: Sep. 5, 2008

(65) Prior Publication Data

US 2009/0145646 A1    Jun. 11, 2009

(51) Int. Cl.
*H05K 1/16* (2006.01)
*H01G 4/228* (2006.01)

(52) U.S. Cl.
USPC ........................................ 174/260; 361/306.1

(58) Field of Classification Search .................. 174/260; 361/306.1
See application file for complete search history.

(56) References Cited

U.S. PATENT DOCUMENTS

| | | | | |
|---|---|---|---|---|
| 4,063,246 A | * | 12/1977 | Greiser | 343/700 MS |
| 4,954,929 A | * | 9/1990 | Baran | 361/794 |
| 5,036,301 A | * | 7/1991 | Takao et al. | 333/185 |
| 5,057,798 A | * | 10/1991 | Moye et al. | 333/33 |
| 6,023,211 A | * | 2/2000 | Somei | 333/246 |
| 6,369,324 B1 | * | 4/2002 | Tomie | 174/650 |
| 6,483,045 B1 | * | 11/2002 | Wang et al. | 174/264 |
| 6,833,512 B2 | * | 12/2004 | Liu | 174/262 |
| 7,148,425 B2 | * | 12/2006 | Wu et al. | 174/255 |
| 7,209,082 B2 | | 4/2007 | Waltho | |
| 7,315,223 B2 | * | 1/2008 | Margomenos | 333/34 |
| 7,361,994 B2 | * | 4/2008 | Ye | 257/758 |
| 7,868,257 B2 | * | 1/2011 | Kushta et al. | 174/262 |
| 2005/0104678 A1 | * | 5/2005 | Shahparnia et al. | 333/12 |
| 2005/0134522 A1 | * | 6/2005 | Waltho | 343/909 |
| 2007/0090398 A1 | * | 4/2007 | McKinzie, III | 257/192 |
| 2007/0120223 A1 | * | 5/2007 | McKinzie et al. | 257/533 |
| 2007/0289771 A1 | * | 12/2007 | Osaka et al. | 174/250 |

(Continued)

FOREIGN PATENT DOCUMENTS

| | | |
|---|---|---|
| JP | 10-209726 | 8/1998 |
| JP | 2004-32232 | 1/2004 |
| TW | 200623974 A | 7/2006 |

OTHER PUBLICATIONS

Japanese Office Action issued Jan. 4, 2011 in corresponding Japanese Patent Application 2008-241772.

(Continued)

*Primary Examiner* — Timothy Thompson
*Assistant Examiner* — Nathan Milakovich

(57) ABSTRACT

According to the present invention, the board can include a dielectric layer; a plurality of conductive plates; and a stitching via, to electrically connect two of the conductive plates to each other. Here, the stitching via can include a first via and a second via, respectively, passing through the dielectric layer and having one end part being placed on a same planar surface as each of the two conductive plates; a connection pattern, having each end part being connected to the other end part of the first via and the second via, respectively; and a first extension pattern, placed on the same planar surface as one of the conductive plates and having one end part being connected to the one end part of the first via and the end part being connected to one of the conductive plates.

13 Claims, 18 Drawing Sheets

U.S. PATENT DOCUMENTS

2009/0038840 A1* 2/2009 Kim et al. .................. 174/376
2009/0039984 A1* 2/2009 Kim et al. .................. 333/212
2010/0127790 A1* 5/2010 Bong et al. .................. 333/12
2010/0134212 A1* 6/2010 Kim et al. .................. 333/202
2010/0134213 A1* 6/2010 Kim et al. .................. 333/202

OTHER PUBLICATIONS

Taiwanese Office Action issued Jul. 27, 2011 in corresponding Taiwanese Patent Application 097134239.

* cited by examiner

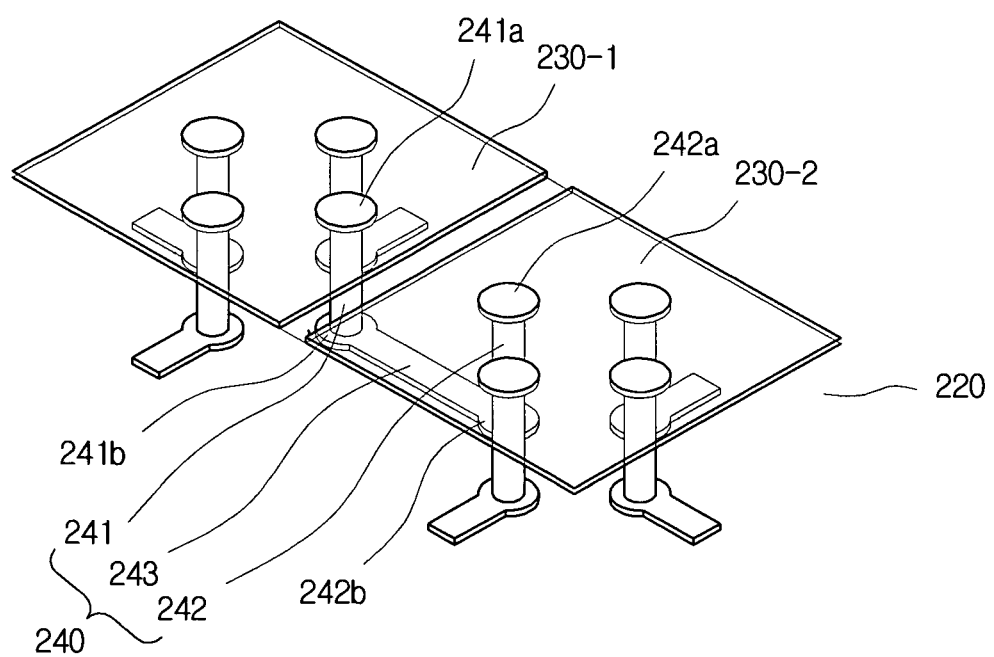

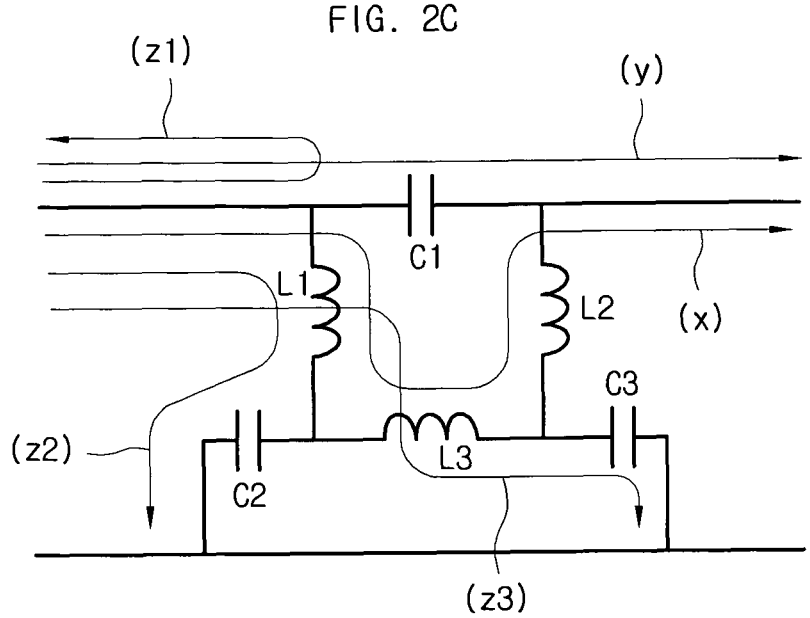

ELECTROMAGNETIC BANDGAP STRUCTURE AND PRINTED CIRCUIT BOARD

CROSS-REFERENCE TO RELATED PATENT APPLICATIONS

This application claims the benefit of Korean Patent Application Nos. 10-2007-0126760 and 10-2008-0057443, filed on Dec. 7, 2007 and Jun. 18, 2008, in the Korean Intellectual Property Office, the disclosure of which is incorporated herein in its entirety by reference.

BACKGROUND OF THE INVENTION

1. Field of the Invention

The present invention relates to an electromagnetic bandgap structure, more specifically to an electromagnetic bandgap structure and a printed circuit board having the same that prevent a signal ranging a predetermined frequency band from being transmitted.

2. Background Art

New electronic apparatuses and communication apparatuses are increasingly becoming smaller, thinner and lighter, reflecting today's emphasis on growing mobility.

These electronic and communication apparatuses have various complex electronic circuits (i.e. analog circuits and digital circuits) for performing their functions and operations. These electronic circuits typically carry out their functions by being implemented in a printed circuit board (PCB). The electronic circuits on the PCB commonly have different operation frequencies from one another.

The printed circuit board in which various electronic circuit boards are implemented often has a noise (i.e. mixed signal) problem, caused by the transfer and interference of an electromagnetic (EM) wave resulted from the operation frequency and its corresponding harmonics components of one electronic circuit to another electronic circuit. The transferred noise can be roughly classified into radiation noise and conduction noise.

The radiation noise can be easily prevented by covering a protective cap on the electronic circuit. However, preventing the conduction noise (refer to the reference numeral 150 of FIG. 1) is not as easy, because the conduction noise is transferred through a signal transfer path inside the board.

The noise problem will be described in more detail with reference to FIG. 1. FIG. 1 is a sectional view showing a printed circuit board including two electronic circuits having different operation frequencies. Although FIG. 1 shows a 4-layered printed circuit board 100, it shall be obvious that the printed circuit board can be modified to have a 2, 6 or 8-layered structure.

As shown in FIG. 1, the printed circuit board 100 includes metal layers 110-1, 110-2, 110-3 and 110-4 (hereinafter, collectively referred to as 110) and dielectric layers 120-1, 120-2 and 120-3 (hereinafter, collectively referred to as 120) interposed between metal layers 110. The top metal layer 110-1 of the printed circuit board 100 is implemented with two electronic circuits 130 and 140 having different operation frequencies (hereinafter, referred to as a first electronic circuit 130 and a second electronic circuit 140, respectively). In a mobile communication apparatus, for example, such as a mobile phone, the two electronic circuits 130 and 140 having different operation frequencies can be a digital circuit, acting as a micro processor, and an RF circuit (i.e. analog circuit), for receiving and transmitting an RF signal, respectively.

Here, if it is assumed that the metal layer represented by the reference numeral 110-2 is a ground layer and the metal layer represented by the reference numeral 110-3 is a power layer, each ground pin of the first electronic circuit 130 and the second electronic circuit 140 is electrically connected to the metal layer represented by the reference numeral 110-2 and each power pin is electrically connected to the metal layer represented by the reference numeral 110-3. In the printed circuit board 100, every ground layer is also electrically connected to each other through vias. Similarly, every power layer is also electrically connected to each other through vias (refer to the reference numeral 160 of FIG. 1).

If the first electronic circuit 130 and the second electronic circuit 140 have different operation frequencies, a conductive noise 150 caused by an operation frequency of the first electronic circuit 130 and its harmonics components is transferred to the second electronic circuit 140. This has a disadvantageous effect on the accurate function/operation of the second electronic circuit 140.

With the growing complexity of electronic apparatuses and higher operation frequencies of digital circuits, it is increasingly more difficult to solve this conduction noise problem. Especially, the typical bypass capacitor method or decoupling capacitor method for solving the conductive noise problem is no longer adequate, as the electronic apparatuses use a higher frequency band.

Moreover, the aforementioned solutions are not adequate when several active devices and passive devices need to be implemented in a complex wiring board having various types of electronic circuits formed on the same board or in a narrow area such as a system in package (SiP) or when a high frequency band is required for the operation frequency, as in a network board.

SUMMARY OF THE INVENTION

The present invention provides an electromagnetic bandgap structure and a printed circuit board having the same that decrease the noise of a particular frequency by having a compact size and a low bandgap frequency.

The present invention also provides an electromagnetic bandgap structure and a printed circuit board having the same that make it easy to design them by having a compact size and acquiring high impedance and high inductance in the case of applying a lot of active elements and passive elements to a narrow area such as a system in package (SiP).

In addition, the present invention provides an electromagnetic bandgap structure and a printed circuit board having the same that solves a mixed signal problem in an electronic apparatus (e.g. a mobile communication apparatus) including an RF circuit and a digital circuit which are placed at the same board.

An aspect of the present invention features an electromagnetic bandgap structure including a dielectric layer; a plurality of conductive plates; and a stitching via, configured to electrically connect any two of the conductive plates to each other. Here, the stitching via can include a first via, passing through the dielectric layer and having an end part being placed on a same planar surface as any one of the two conductive plates; a second via, passing through the dielectric layer and having an end part being placed on a same planar surface as the other of the two conductive plates; a connection pattern, having one end part being connected to the other end part of the first via and the other end part being connected to the other end part of the second via; and a first extension pattern, placed on a same planar surface as any one of the conductive plates and having one end part being connected to the one end part of the first via and the other end part being connected to any one of the conductive plates.

The electromagnetic bandgap structure can further include a conductive layer. Here, the dielectric layer can be placed between the conductive plates and the conductive layer. At this time, the conductive layer can include a clearance hole, and the connection pattern can be accommodated in the clearance hole.

The stitching via can further include a second extension pattern, placed on a same planar surface as the other conductive plate and having one end part being connected to the one end part of the second via and the other end part being connected to the other conductive plate.

The conductive plate can be placed on a same planar surface. The conductive plates can have a same size. Alternatively, the conductive plates can be distinguished into a plurality of groups having different conductive plate sizes. In addition, the conductive plate can have a polygonal, circular or elliptical shape.

Another aspect of the present invention features a printed circuit board including an electromagnetic bandgap structure, configured to include a dielectric layer, a plurality of conductive plates and a stitching via to electrically connecting any two of the conductive plates to each other and arranged at an area of a noise transferable path between a noise source point and a noise blocking destination point of the printed circuit board Here, the stitching via can include a first via, passing through the dielectric layer and having an end part being placed on a same planar surface as any one of the two conductive plates; a second via, passing through the dielectric layer and having an end part being placed on a same planar surface as the other of the two conductive plates; a connection pattern, having one end part being connected to the other end part of the first via and the other end part being connected to the other end part of the second via; and a first extension pattern, placed on the same planar surface as any one of the conductive plates and having one end part being connected to the one end part of the first via and the other end part being connected to any one of the conductive plates.

The printed circuit board can further include a conductive layer. Here, the dielectric layer can be placed between the conductive plates and the conductive layer. At this time, the conductive layer can include a clearance hole, and the connection pattern can be accommodated in the clearance hole.

The conductive layer can be one of a ground layer and a power layer, and the conductive plates can be electrically connected to the other.

The conductive layer can be a ground layer, and the conductive plates can be electrically connected to a signal layer.

The stitching via can further include a second extension pattern, placed on a same planar surface as the other conductive plate and having one end part being connected to the one end part of the second via and the other end part being connected to the other conductive plate.

The conductive plate can be placed on a same planar surface. The conductive plates can have a same size. Alternatively, the conductive plates can be distinguished into a plurality of groups having different conductive plate sizes. In addition, the conductive plate can have a polygonal, circular or elliptical shape.

Two electronic circuits having different operation frequencies can be implemented in the printed circuit board, and the noise resource point and the noise blocking destination point can correspond to one position and another position, respectively, in which the two electric circuits are to be implemented.

BRIEF DESCRIPTION OF THE DRAWINGS

These and other features, aspects and advantages of the present invention will become better understood with regard to the following description, appended claims and accompanying drawings where:

FIG. 2B is a 3-D perspective view showing another example of an electromagnetic bandgap structure including a stitching via as a comparison object of the present invention;

FIG. 2C shows an equivalent circuit of the electromagnetic bandgap structure shown in FIG. 2A;

DESCRIPTION OF THE EMBODIMENTS

Figure 1:
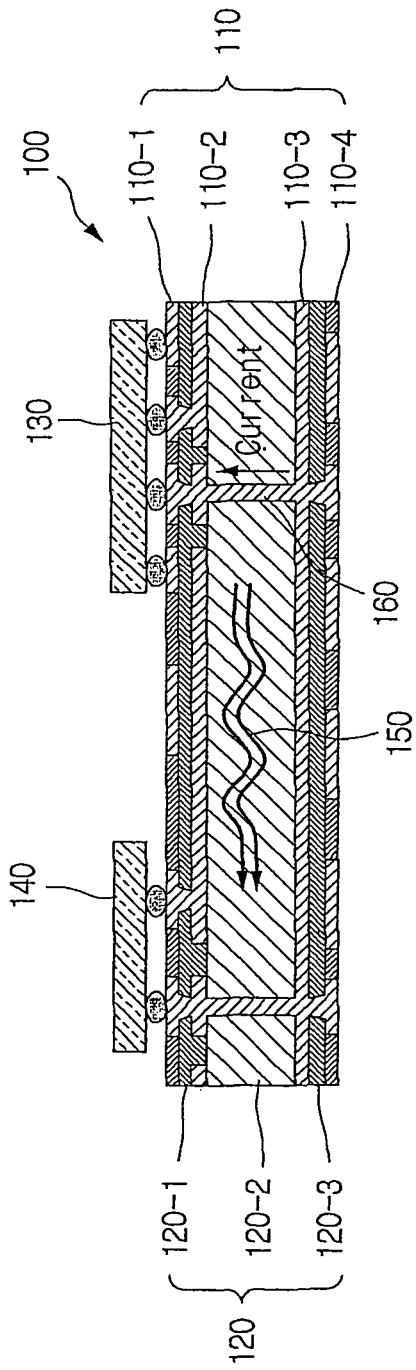
FIG. 1 is a sectional view showing a printed circuit board including an analog circuit and a digital circuit.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, some examples of an electromagnetic bandgap structure having a stitching via as a comparison object in accordance with some embodiments of the present invention will be described with reference to FIG. 2A through FIG. 2C for easy understanding of the present invention before an electromagnetic bandgap structure and a printed circuit board having the same are described with reference to the accompanying drawings.

Although a metal layer and a metal plate are used throughout the description of the structure of an electromagnetic bandgap of the present invention. However, it shall be evidently understood by any person of ordinary skill in the art that any other conductive layers and plates can be substituted for the metal layer and the metal plate.

Figure 2A:
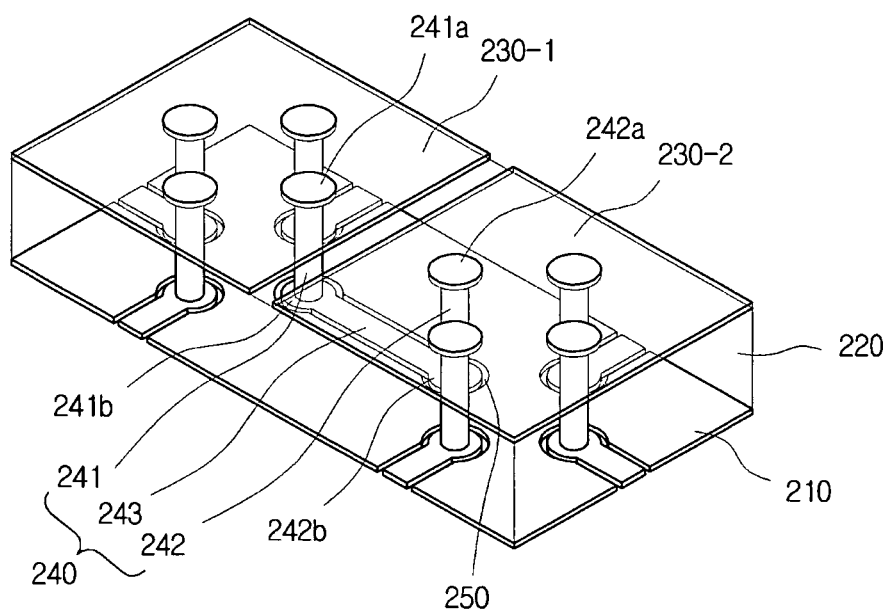
FIG. 2A is a 3-D perspective view showing an example of an electromagnetic bandgap structure including a stitching via as a comparison object of the present invention.
Figure 3:
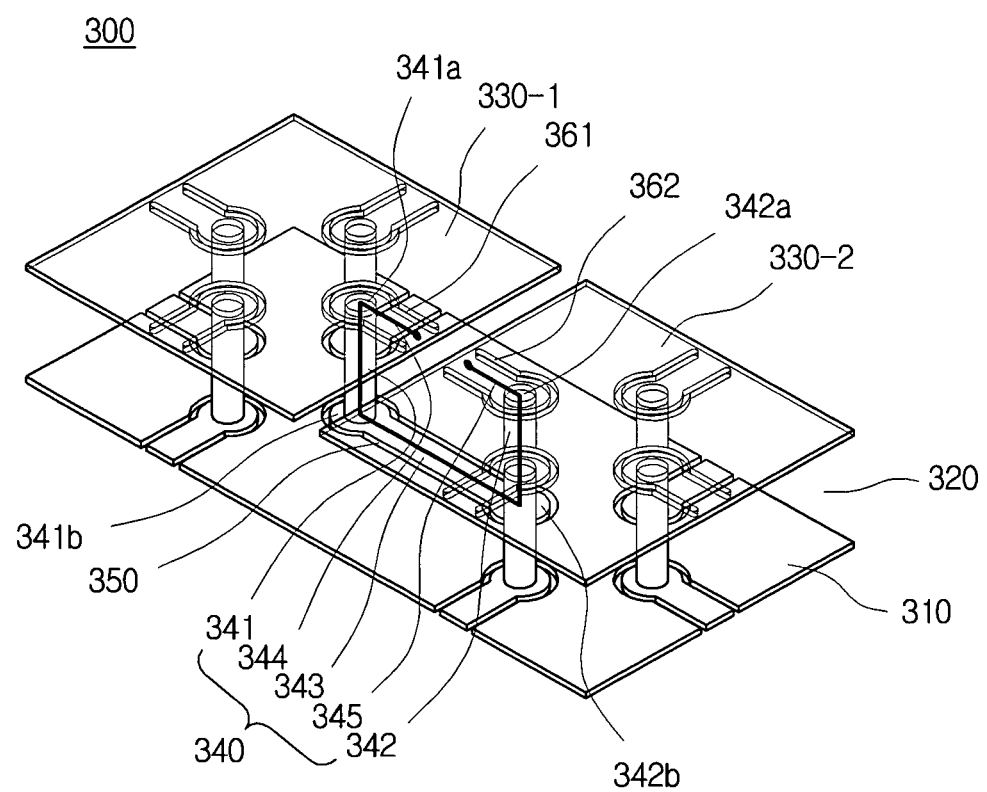
FIG. 3 is a 3-D perspective view showing an electromagnetic bandgap structure including a stitching via in accordance with a first embodiment of the present invention.

Also, even though FIG. 2A, FIG. 2B and FIG. 3 show only two metal plates for the convenience of illustration, the electromagnetic bandgap structure can have a plurality of metal plates as its elements as shown in FIG. 4A through FIG. 7B.

An electromagnetic bandgap structure 200 shown in FIG. 2A can include a metal layer 210, a plurality of metal plates 230-1 and 230-2 (hereinafter, referred to as a first metal plate 230-1 and a second metal layer 230-2) spaced from the metal layer 210 and a stitching via 240. In other words, the electromagnetic bandgap structure 200 shown in FIG. 2A can have 2-layered structural form including a first layer in which the metal layer 210 is placed and a second layer in which the plurality of metal plates 230-1 and 230-2 are placed. A dielectric layer 220 can be interposed between the metal layer 210 and the plurality of metal plates 230-1 and 230-2.

Here, FIG. 2A merely show elements constituting the electromagnetic bandgap structure (i.e. a part constituting the 2-layered electromagnetic bandgap including the stitching via) for the convenience of illustration (also, in the case of FIG. 2B and FIG. 3). Accordingly, the first layer in which the first metal layer 210 shown in FIG. 2A is placed and the second layer in which the plurality of metal plates 230-1 and 230-2 shown in FIG. 2A are placed may be any two layers of a multi-layered printed circuit board.

In other words, it shall be obvious that there can be at least one additional metal layer below the metal layer 210, above the metal plates 230-1 and 230-2 and/or between the metal layer 210 and the metal plates 230-1 and 230-2.

For example, the electromagnetic bandgap structure 200 shown in FIG. 2A can be placed between any two metal layers functioning as the power layer and the ground layer, respectively, in a multi-layered printed circuit board in order to block the conductive noise (the same can be applied to electromagnetic bandgap structures shown in FIG. 2B and FIG. 3 in accordance with other embodiments of the present invention).

Since the conductive noise problem is not limited to the space between the power layer and the ground layer, the electromagnetic bandgap structure shown in FIG. 2A through FIG. 4B can be placed between any two ground layers or power layers placed on different layers from each other in a multi-layered printed circuit board.

Accordingly, the metal layer 210 may be any metal layer for transferring an electric signal in a printed circuit board. The metal layer 210, for example, can be any metal layer functioning as the power layer or the ground layer or any metal layer functioning as a signal layer constituting a signal line.

The metal layer 210 can be placed on a planar surface different from the planar surface in which the plurality of metal plates are placed and electrically separated from the plurality of metal plates 230-1 and 230-2. In other words, the metal layer 210 can form a layer that is different from the plurality of metal plates 230-1 and 230-2 in regard to electrical signals in the printed circuit board.

For example, if the metal layer 210 is the power layer, the metal plates can be electrically connected to the ground layer. If the metal layer 210 is the ground layer, the metal plates can be electrically connected to the power layer. Alternatively, if the metal layer 210 is the signal layer, the metal plates can be electrically connected to the ground layer. If the metal layer 210 is the ground layer, the metal plates can be electrically connected to the signal layer.

The plurality of metal plates 230-1 and 230-2 can be placed on a planar surface above the metal layer 210. Any two metal plates can be electrically connected to each other through a stitching via. As such, each stitching via electrically connecting any two metal plates to each other can electrically connect every metal plate as one circuit.

Here, FIG. 2A shows the form (i.e. the form of FIG. 6) that a metal plate and its adjacent metal plates can be electrically connected to each other through each one stitching via, and as a result, every metal plate can be electrically connected to each other. However, as long all metal plates can be formed as a closed loop by being electrically connected to each other, it can be possible to use any method of connecting the metal plates to each other through the stitching via.

Also, even though FIG. 2A shows only two metal plates having square shapes of the same size for the convenience of illustration, various other modifications can be possible (the same can be applied to FIG. 2B and FIG. 3). This will be briefly described with reference to FIG. 6A through FIG. 6E.

Figure 6A:
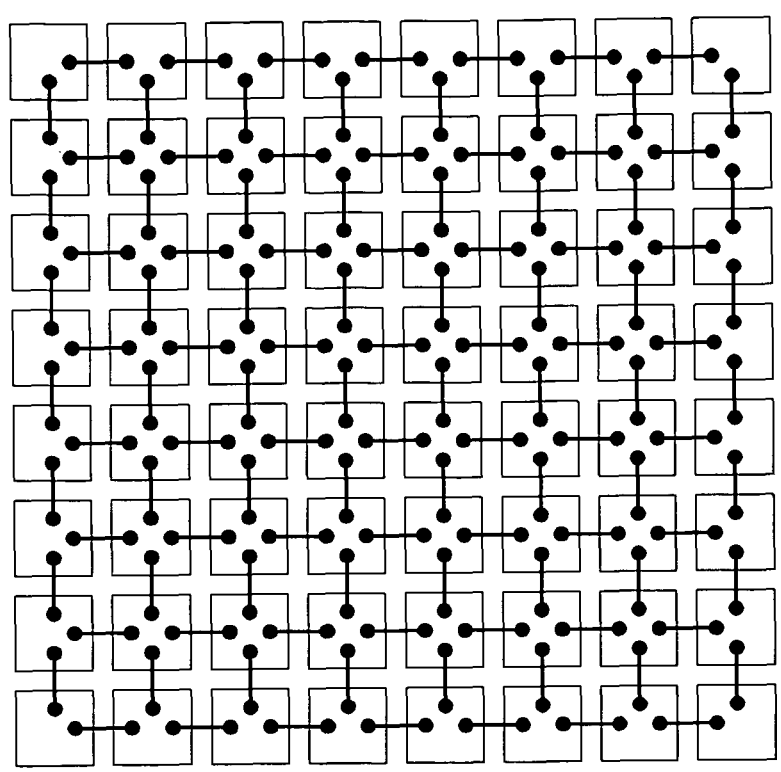
FIG. 6A is a plan view showing a configuration of an electromagnetic bandgap structure including a rectangular metal plate.
Figure 6B:
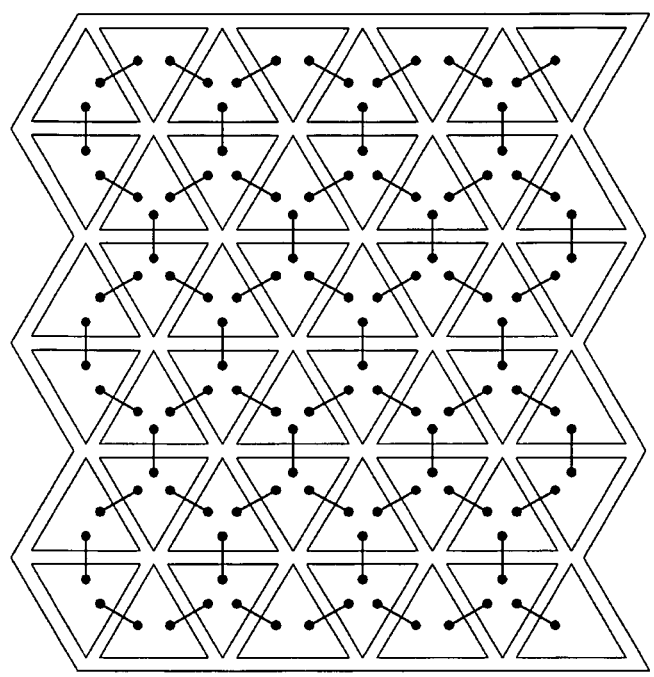
FIG. 6B is a plan view showing a configuration of an electromagnetic bandgap structure including a triangular metal plate.
Figure 6C:
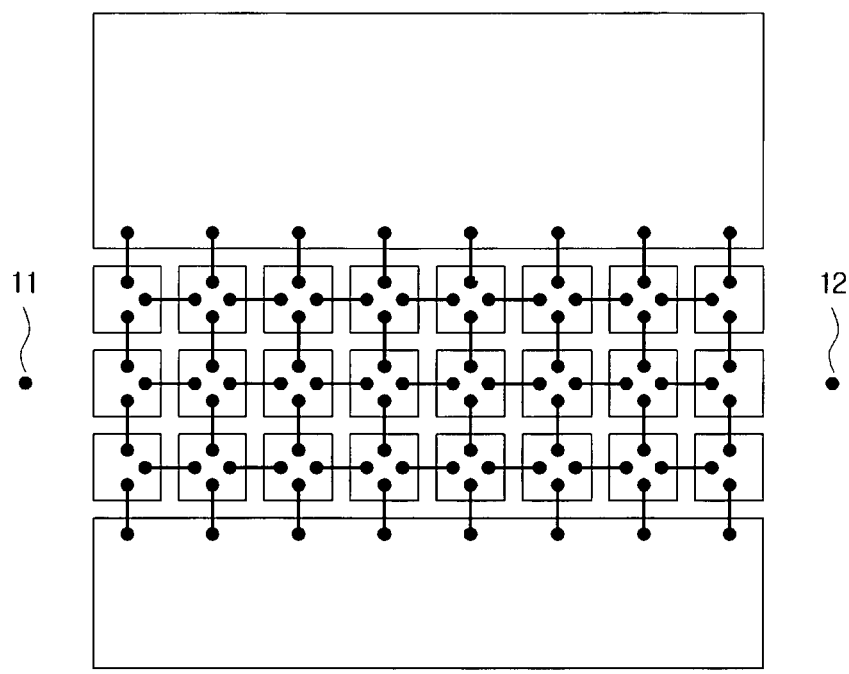
FIG. 6C is a plan view showing a band-shaped configuration of an electromagnetic bandgap structure.

For example, the metal plates can have various polygonal shapes including not only a rectangle as shown in FIG. 6A, and a triangle, as shown in FIG. 6B, but also a hexagon, an octagon. Of course, the metal plate may not be limited to a certain shape such as a circle or an ellipse. Each of the metal plates can also have the same size (e.g. area and thickness) as shown in FIG. 6A, FIG. 6B and FIG. 6C. If the metal plates have different sizes, the metal plates can be distinguished and disposed according to each of a plurality of groups having different sizes as shown in FIG. 6D or FIG. 6E.

Figure 6D:
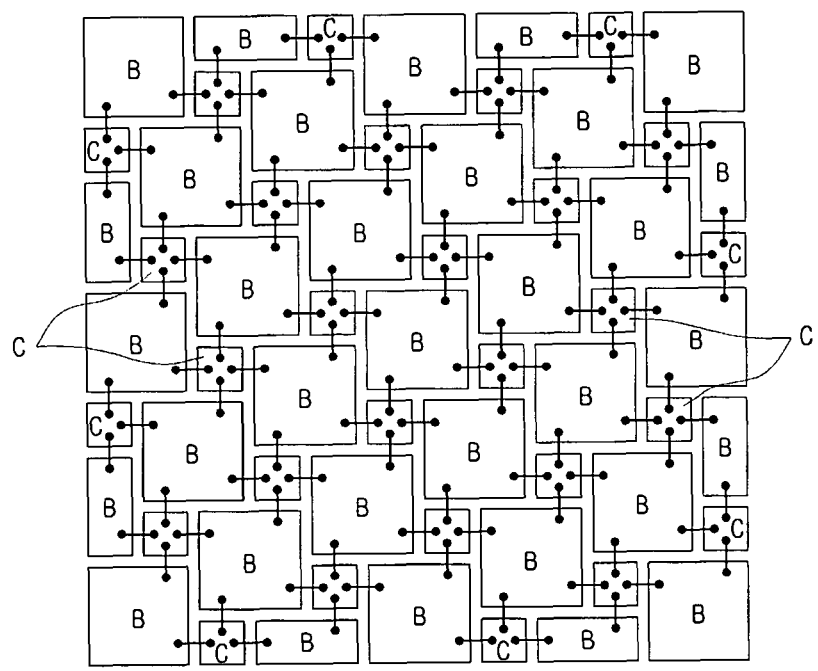
FIG. 6D and FIG. 6E are plan views showing a configuration of an electromagnetic bandgap structure including a plurality of groups having different sized metal plates.

In the case of FIG. 6D, metal plates B having a relatively bigger size and metal plates C having a relatively smaller size can be alternately arranged, and each metal plate can be electrically connected to its adjacent metal plates, respectively, through the stitching vias.

Figure 6E:
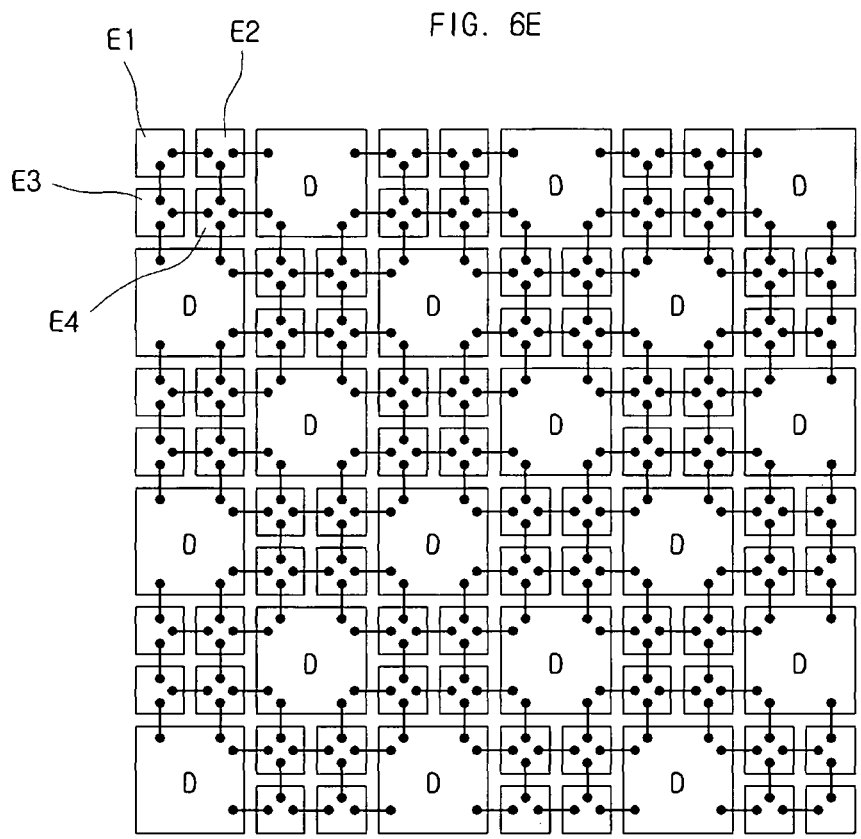

In the case of FIG. 6E, metal plates D having a relatively bigger size and metal plates E1, E2, E3 and E4 having a relatively smaller size can be arranged. The small metal plates E1, E2, E3 and E4 can be grouped in a 2×2 form. Each group consisting of the 4 small metal plates E1, E2, E3 and E4 can occupy the area similar to the large metal plate D. The small metal plates E1, E2, E3 and E4 can be electrically connected to corresponding adjacent metal plates through 4 stitching vias. Also, since there are 8 small metal plates around the large metal plate D, the large metal plate D can be electrically connected to its adjacent small metal plates through 8 stitching vias.

Since FIG. 6A through FIG. 6E show each of the electromagnetic bandgap structures arranged in the printed circuit board when viewed from an upper surface, each one metal plate can correspond to each cell of the electromagnetic bandgap structure.

In particular, FIG. 6A, FIG. 6B, FIG. 6D and FIG. 6E show the case that the electromagnetic bandgap structures are repeatedly arranged on the whole part of an inner surface of the printed circuit board. FIG. 6C shows the case that the electromagnetic bandgap structures are arranged on a part of an inner surface of the printed circuit board.

Briefly, while the cells of the electromagnetic bandgap structures can be densely arranged on the whole part of an inner surface of the printed circuit board as shown in FIG. 6A, the cells can be naturally arranged on some paths as shown in FIG. 6C.

For example, as shown in FIG. 6C, if it is assumed that a point 11 refers to a noise source point and a point 12 refers to a noise blocking destination point, the cells can be repeatedly arranged in at least one line along a noise transferable path between the noise source point 11 and the noise blocking destination point 12. Alternatively, as shown in FIG. 6C, if it is assumed that a point 21 refers to the noise source point and a point 22 refers to the noise blocking destination point, the cells can be arranged in at least one line to have the shape crossing and blocking a noise transferable path between the noise source point 21 and the noise blocking destination point 22 (i.e. the shape of being shielded by a blocking shield).

Here, if it is assumed that any two electric circuits having different operation frequencies (refer to the first electric circuit 130 and the second electric circuit 140 in FIG. 1, described above) are implemented in the printed circuit board, the noise resource point and the noise blocking destination point can correspond to each position in which the two electric circuits will be implemented.

A stitching via can electrically connect any two of a plurality of metal plates to each other. All drawings of this specification show that the stitching via electrically connects two adjacent metal plates to each other. However, it may be unnecessary that any two metal plates connected by the stitching via are adjacent to each other.

Also, even though it is shown that one metal plate is connected to another metal plate by one stitching via, it is obviously unnecessary that the electromagnetic bandgap structure has any limitation to the number of the stitching vias connecting any two metal plates.

However, all below descriptions focus on the case that two adjacent metal plates are connected to each other by one stitching via.

The stitching via 240 can be formed to include a first via 241, a second via 242 and a connection pattern 243 in order to electrically connect two adjacent metal plates.

Herein, the first via 241 can be formed to start from one end part 241a connected to the first metal plate 230-1 and penetrate the dielectric layer 220, and the second via 242 can be formed to start from one end part 242a connected to the second metal plate 230-2 and penetrate the dielectric layer 220. The connection pattern 243 can be placed on the same planar surface as the metal layer 210 and have one end part, connected to the other end part 241b of the first via 241, and the other end part, connected to the other end part 242b of the second via 242.

At this time, it is obvious that a via land having a larger size than the via can be formed at one end part and the other end part of each via in order to reduce a position error of a drilling process for forming the via. Accordingly, the pertinent detailed description will be omitted.

Also, a clearance hole 250 can be formed at an edge of the connection pattern 243 of the stitching via 240 in order to prevent the metal plates 230-1 and 230-2 to be electrically connected to the metal layer 210. In other words, the connection pattern 243 can be accommodated in the clearance hole 250.

It shall be evident here that, in order to allow the metal plates to be electrically connected to each other, it is necessary that a plating layer be formed on an inner wall only of the first via 241 and the second via 242 of the stitching via 240 or the inside of the stitching via 240 be filled with a conductive material (e.g. a conductive paste), and the connection pattern 243 be a conductive material such as a metal.

As a result, the two adjacent metals 230-1 and 230-2 may not be connected on the same planar surface in the electromagnetic bandgap structure of FIG. 2A. Instead, the two adjacent metals 230-1 and 230-2 can be connected to each other through another planar surface (i.e. the same planar surface as the metal layer 210) by the stitching via 240. Accordingly, the electromagnetic bandgap structure 200 having the stitching via 240 of FIG. 2A can more easily acquire an inductance component with a longer length than that of connecting the adjacent metal plates to each other on the same planar surface under the same conditions.

In addition, since the adjacent metal plates of the present invention are connected to each other by the stitching via 240, it is unnecessary to form an additional pattern for electrically connecting the metal plates placed on two layers. This can make a spaced distance between the metal plates narrower. Accordingly, it can be possible to increase the capacitance component formed between the adjacent metal plates.

Below is described the principle by which the structure shown in FIG. 2A can function as the electromagnetic bandgap structure blocking a signal of a certain frequency band.

The dielectric layer 220 can be interposed between the metal layer 210 and the metal plates 230-1 and 230-2. This may cause a capacitance component to be formed between the metal layer 210 and the metal plates 230-1 and 230-2 and between the two adjacent metal plates. Also, there may be an inductance component connecting through the first via 241→the connection pattern 243→the second via 242 between the two adjacent metal plates by the stitching via 240.

At this time, the value of the capacitance component can be varied according to various factors such as the spaced distances between the metal layer 210 and the metal plates 230-1 and 230-2 and between the two adjacent metal plates, the dielectric constant of a dielectric material forming the dielectric layer 220 and the size, shape and area of the metal plate.

Also, the value of the inductance component can be varied according to various factors such as the shape, length, depth, width and area of the first via 241, a second via 242 and/or the connection pattern 243.

Accordingly, adjusting and designing various aforementioned factors adequately can make it possible to allow the structure of FIG. 2A to function as the electromagnetic bandgap structure (i.e. a band stop filter) for removing or blocking a certain noise or a certain signal of an object frequency band. This can be easily understood through the equivalent circuit of FIG. 2C.

Comparing the equivalent circuit of FIG. 2C with the electromagnetic bandgap structure of FIG. 2A, an inductance component L1 can correspond to the fist via 241, and an inductance component L2 can correspond to the second via 242. An inductance component L3 can correspond to the connection pattern 243. C1 can be a capacitance component by the metal plates 230-1 and 230-2 and another dielectric layer and another metal layer to be placed above the metal plates 230-1 and 230-2. C2 and C3 can be capacitance components by the metal layer 210 placed on the same planar surface as the connection pattern 243 and another dielectric layer and another metal layer to be placed below the planar surface of the connection pattern 243.

The electromagnetic bandgap structure shown in FIG. 2A can function as a band stop filter, which blocks a signal of a certain frequency band according to the above equivalent circuit.

In other words, as seen in the equivalent circuit of FIG. 2C, a signal x of a low frequency band (refer to FIG. 2C) and a signal y of a high frequency band (refer to FIG. 2C) can pass through the electromagnetic bandgap structure, and signals z1, z2 and z3 of a certain frequency band (refer to FIG. 2C) ranging between the low frequency band and the high frequency band are blocked by the electromagnetic bandgap structure.

Accordingly, if the structure of FIG. 2A is repeatedly arranged on a whole part (refer to FIG. 6A. FIG. 6B, FIG. 6D and FIG. 6E) or a part (refer to FIG. 6C) of an inner surface of the printed circuit board (the same can be applied to the structure of FIG. 3) as a noise transferable path, it is possible to function as the electromagnetic bandgap structure that can prevent a signal of a certain frequency band from being transferred.

The identical or similar idea can be applied to the electromagnetic bandgap structure of FIG. 2B.

The electromagnetic bandgap structure of FIG. 2B has no metal layer corresponding to the metal layer 210 as compared with the electromagnetic bandgap structure of FIG. 2A.

It may be unnecessary that the electromagnetic bandgap structure having a stitching via include a metal layer, placed below an area in which there is the stitching via and. This may be because it is not always necessary that the connection pattern 243 of the stitching via 240 be formed on a space in which there is the metal layer.

In other words, if there is a metal layer on the same planar surface to correspond to an area on which the connection pattern 243 will be formed, the connection pattern 243 can be manufactured in the form of being accommodated in the clearance hale 250 formed in the metal layer 210 on the same planar surface as shown in FIG. 2A. However, no additional metal may be placed in the area in which the connection pattern 243 will be formed, as shown in FIG. 2B. Of course, there may be the dielectric layer 220 below the metal plates in FIG. 2B.

Also, it may not be always necessary that the 2-layered electromagnetic bandgap structure including the stitching via is formed to have a stacked structural form in which the metal plates 230-1 and 230-2 are stacked in the dielectric layer 220 and the dielectric layer 220 is stacked in the metal layer 210. In other words, the 2-layered electromagnetic bandgap structure including the stitching via can be formed to have another structural shape including a lower layer in which the metal plates are placed, an upper layer in which the metal layer is placed, the dielectric layer interposed between the lower layer and the upper layer and the stitching via, penetrating the dielectric layer (i.e. a structural form, with the position of the upper layer and the lower layer inversed from that of FIG. 2A). Of course, it can be expected that the electromagnetic bandgap structure shown in FIG. 2A has the identical or similar noise blocking effect to that of FIG. 2B.

Hereinafter, the electromagnetic bandgap structure more extendedly employing the basic principle of the aforementioned noise blocking in accordance with the embodiments of the present invention will be described in detail with reference to FIG. 3 through FIG. 5C and FIG. 7A through FIG. 7C.

Firstly, the electromagnetic bandgap structure, shown in the related drawings, in accordance with some embodiments of the present invention has the same structural form as that of FIG. 2A through FIG. 2C, except for the point that the stitching via further includes an extension pattern. Accordingly, it can be clearly understood by any person of ordinary skill in the art that the general details of the above-described electromagnetic bandgap structure shown in FIG. 2A through FIG. 2C and FIG. 6A and FIG. 6E and its noise blocking principle can be identically or similarly applied to the below-described electromagnetic bandgap structure in accordance with the embodiments of the present invention.

Figure 4A:
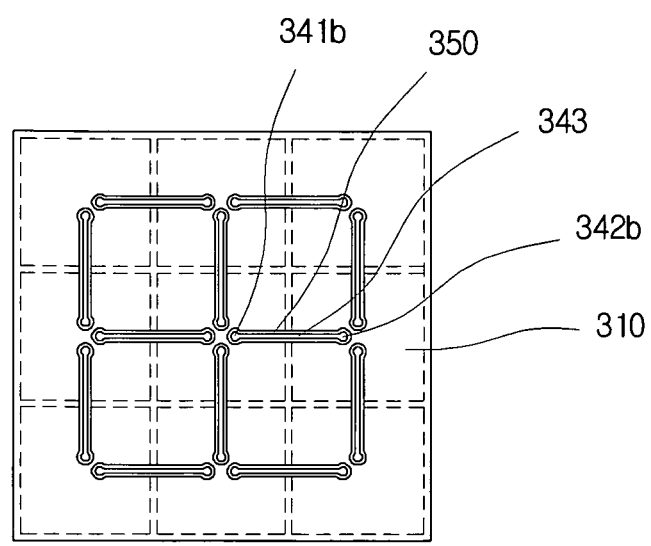
FIG. 4A shows a connection pattern of the electromagnetic structure shown in FIG. 3.

FIG. 3 is a 3-D perspective view showing an electromagnetic bandgap structure including a stitching via in accordance with a first embodiment of the present invention. FIG. 4A shows a connection pattern of the electromagnetic structure shown in FIG. 3, and FIG. 4B shows an extension pattern of the electromagnetic structure shown in FIG. 3.

Figure 4B:
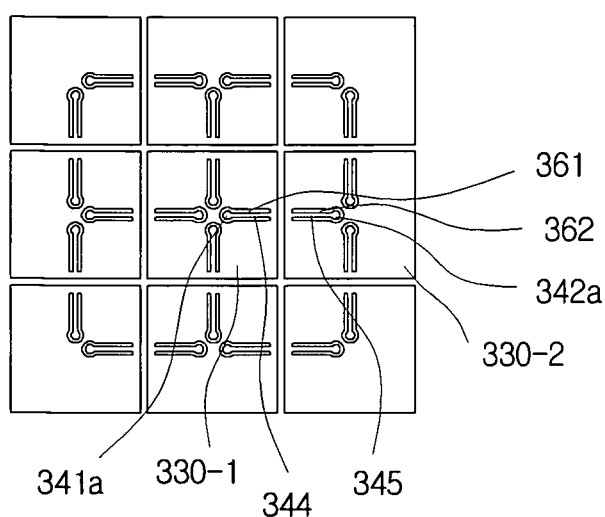
FIG. 4B shows an extension pattern of the electromagnetic structure shown in FIG. 3.

As shown in FIG. 3 through FIG. 4B, the electromagnetic bandgap structure 300 in accordance with an embodiment of the present invention can includes a metal layer 310, a plurality of metal plates 330-1 and 330-2 (Hereinafter, referred to as a first metal layer and a second metal layer, respectively) spaced from the metal layer 310 and a stitching via 340.

As such, the electromagnetic bandgap structure 300 can have two-planar-surface structural form. For example, the metal layer 310 can be placed in a first layer, and the metal plates 330-1 and 330-2 can be placed in a second layer. Alternatively, as described above, the metal layer 310 can be placed in the second layer, and the metal plates 330-1 and 330-2 can be placed in the first layer. At this time, a dielectric layer 320 can be interposed between the first and second layers.

Even though FIG. 3 shows only two metal plates, which are adjacent to each other in a lengthwise direction, instead of showing the plurality of metal plates, for the convenience of illustration, the plurality of other metal plates can be arranged on any area at left, right, upper and/or lower sides about any one metal plate.

In accordance with the present invention, the stitching via 340 can be formed to include a first via 341, a second via 342 and a connection pattern 343, similarly to that of FIG. 2A, thereby connecting two adjacent metal plates to each other electrically. In particular, the first via 341 can pass through the dielectric layer 320 and have one end part 341a placed on the same planar surface as the first metal plate 330-1, and the second via 342 can pass through the dielectric layer 320 and have one end part 342a placed on the same planar surface as the second metal plate 330-2.

The connection pattern 343 can be also placed on the same planar surface and have one end part connected to the other end part 341b of the first via 341 and the other end part connected to the other end part 342b of the second via 342, A clearance hole 350 can be also formed at an edge of the connection pattern 343 of the stitching via 340 in order to prevent the metal plates 330-1 and 330-2 from being electrically connected to the metal layer 310.

Of course, no metal (refer to the metal layer 310 of FIG. 3) may be placed in the area in which the connection pattern 343 will be formed (refer to the aforementioned description with reference to FIG. 2B). In this case, it can be unnecessary to include a clearance hole additionally as described above.

In the electromagnetic bandgap structure 300 in accordance with another embodiment of the present invention, the stitching via 340 can further include extension patterns 344 and 345 (hereinafter, referred to as a first extension pattern and a second extension pattern, respectively).

Here, the first extension pattern 344 can be formed in the pattern of starting from the end part 341a of the first via 341 and extending from the same planar surface (i.e. the first metal plate 330-1), and the second extension pattern 345 can be formed in the pattern of starting from the end part 342a of the second via 342 and extending from the same planar surface (i.e. the second metal plate 330-2).

In other words, the first extension pattern 344 can have one end part connected to the end part 341a of the first via 341 and the other end part connected to the first metal plate 330-1, thereby connecting the first via 341 and the first metal plate 330-1 electronically. Similarly, the second extension pattern 345 can have one end part connected to the end part 342a of the second via 342 and the other end part connected to the second metal plate 330-2, thereby connecting the second via 342 and the second metal plate 330-2 electronically.

The patterns of the first extension pattern 344 and the second extension pattern 345 can be relatively determined according to each shape of an etched hole 361 of an adjacent area of the end part 341a of the first via 341 and an etched hole 362 of an adjacent area of the end part 342a of the second via 342.

Accordingly, even though each drawing of this specification shows the case that the extension pattern has a bar shape, the extension pattern can have various types (e.g. a trace type and a spiral type) having limitation of not being disconnected from the metal plate. Accordingly, the etched holes 361 and 362 may be required to be formed in the open curved shape instead of the closed curved shape in order to allow the metal plate not to be disconnected from the extension pattern.

Accordingly, in accordance with the present invention, the two adjacent metal plates 330-1 and 330-2 can be electrically connected to each other through the stitching via 340 in the order of the first metal plate 330-1→the first extension pattern 344→the first via 341→the connection pattern 343→the second via 342→the second extension pattern 345→the second metal plate 330-2 (it is assumed that a signal proceeds from the first metal plate 330-1 to the second metal plate 330-2).

In other words, since the stitching via 340 of FIG. 3 can further include the extension patterns as compared with FIG. 2A, it can be possible to additionally acquire the inductance value as much as the length component extended by the extension pattern in the same condition as compared with the FIG. 2A. Accordingly, if using only one of the first extension pattern 344 and the second extension pattern 345 can make acquire the necessary inductance value enough, the other one can be omitted.

At this time, the metal layer 310 can function as any one of the power layer and the ground layer in a typical printed circuit board. The plurality of metal plates 330-1 and 330-2 can be also formed as one closed circuit by allowing each adjacent metal plate to be connected to each other, to thereby function as the other one of the power layer and the ground layer.

Alternatively, if it is assumed that the electromagnetic bandgap structure 300 of the present invention is applied to a system in package (SIP), the metal layer 310 can function as the ground layer, and the plurality of metal plates 330-1 and 330-2 connected through the stitching via 340 can function as a signal layer for transferring a signal.

In accordance with the aforementioned principle, the electromagnetic bandgap structure 300 can be arranged in an area of a noise transferable path between a noise source point and a noise blocking destination point, thereby blocking or reducing a noise of a certain frequency band. The noise resource point and the noise blocking destination point can correspond to one position and another position, respectively, in which the two electric circuits are to be implemented.

The foresaid electromagnetic bandgap structure of FIG. 3 through FIG. 4B is being described based on the assumption that any one metal plate can be connected to other metal plates, each of which is arranged in upper, lower, left and light sides about the metal plate, through corresponding stitching vias, that all the metal plates can be placed on a same planar surface and that every metal plate can have the same shape and size.

However, it shall be obvious that the present invention is not limited to this aforementioned embodiment and various other embodiments and modifications are possible. In the electromagnetic bandgap structure, for example, each metal plate can have various shapes (e.g. polygons, circles, and ellipses) and different sizes. Alternatively, each metal plate can be arranged on two or more different planar surfaces individually, collectively or on a certain rule basis.

If at least one of the metal plates is stacked in a planar surface that is different from the planar surface in which the other metal plates are stacked, the electromagnetic bandgap structure will have two or more layers. However, this increased number of layers may have no disadvantageous effect on the design when the electromagnetic bandgap structure of the present invention is applied to a multi-layered printed circuit board.

Figure 5A:
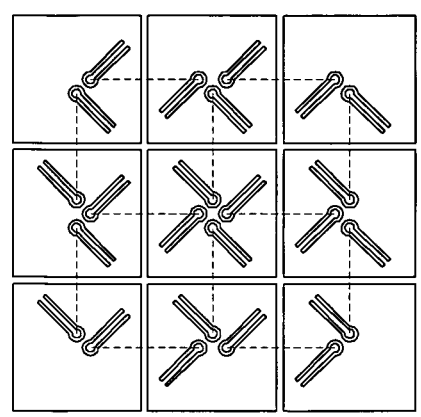
FIG. 5A through FIG. 5C are plan views showing an electromagnetic bandgap structure in accordance with a second embodiment through a fourth embodiment, respectively, of the present invention.
Figure 5B:
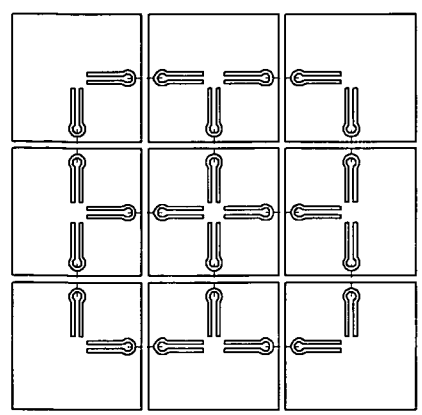
Figure 5C:
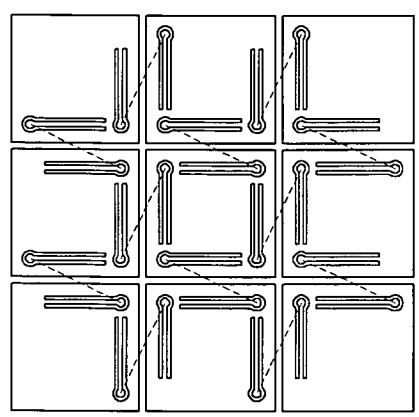

Moreover, FIG. 5A through FIG. 5C show various examples of the extension pattern in accordance with a variety of embodiments and modifications of the present invention. FIG. 5A through FIG. 5C, particularly, show that the extension pattern is designed to have different positions and directions according to the formation positions of the first via 341 and the second via 342. Here, the dotted lines indicate the connection pattern in FIG. 5A through FIG. 5C.

Figure 7A:
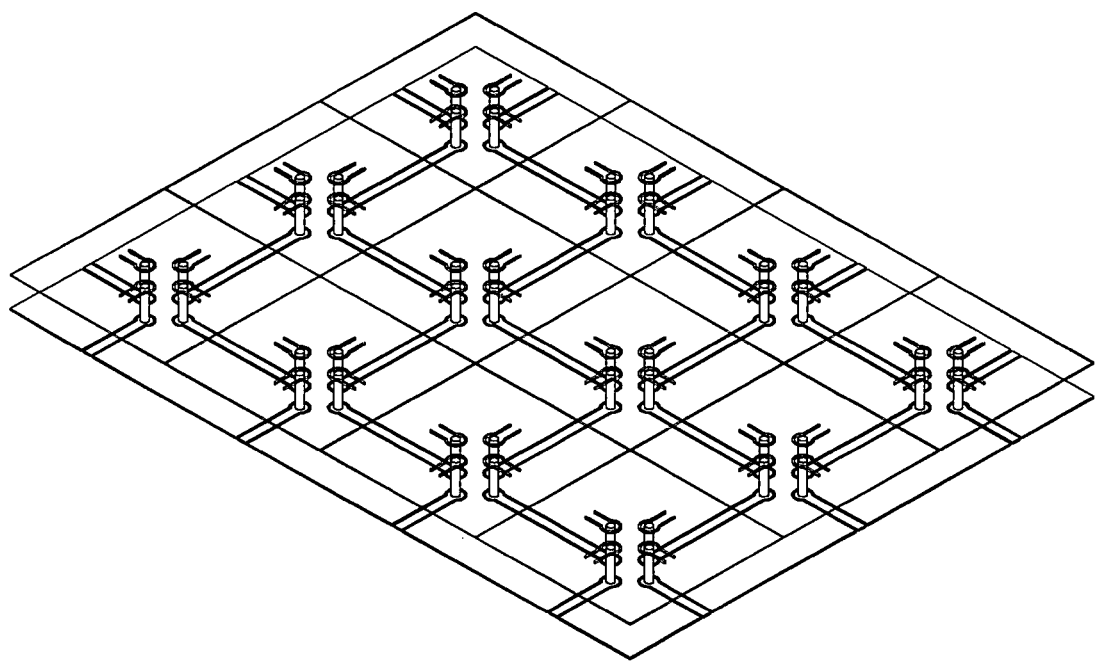
FIG. 7A and FIG. 7B show example models for checking noise blocking possibility of an electromagnetic bandgap structure in accordance with an embodiment of the present invention.
Figure 7B:
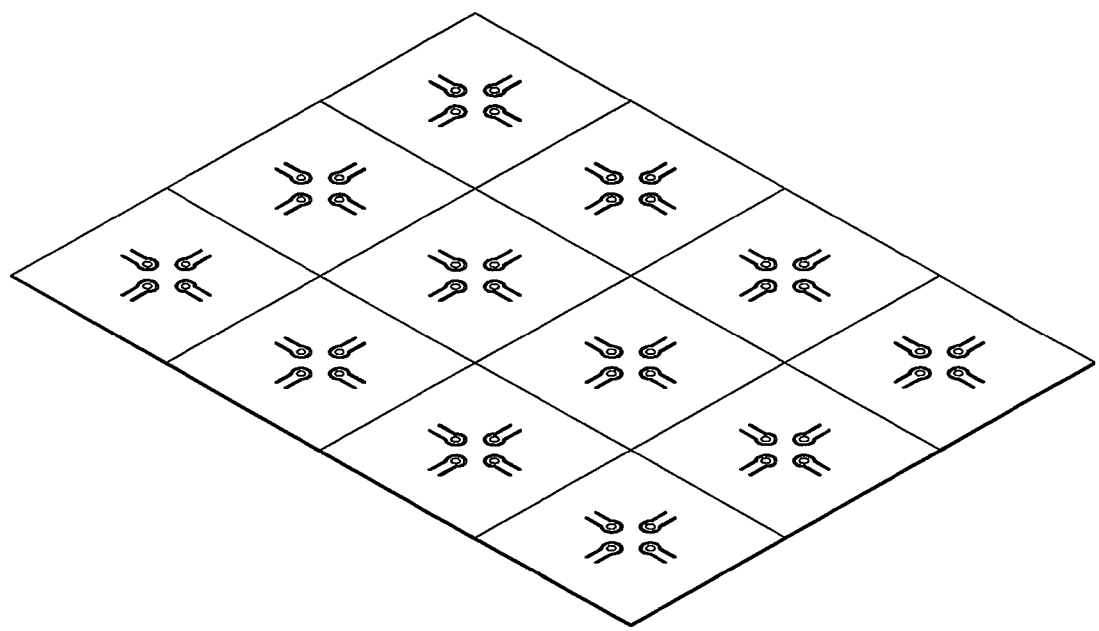
Figure 7C:
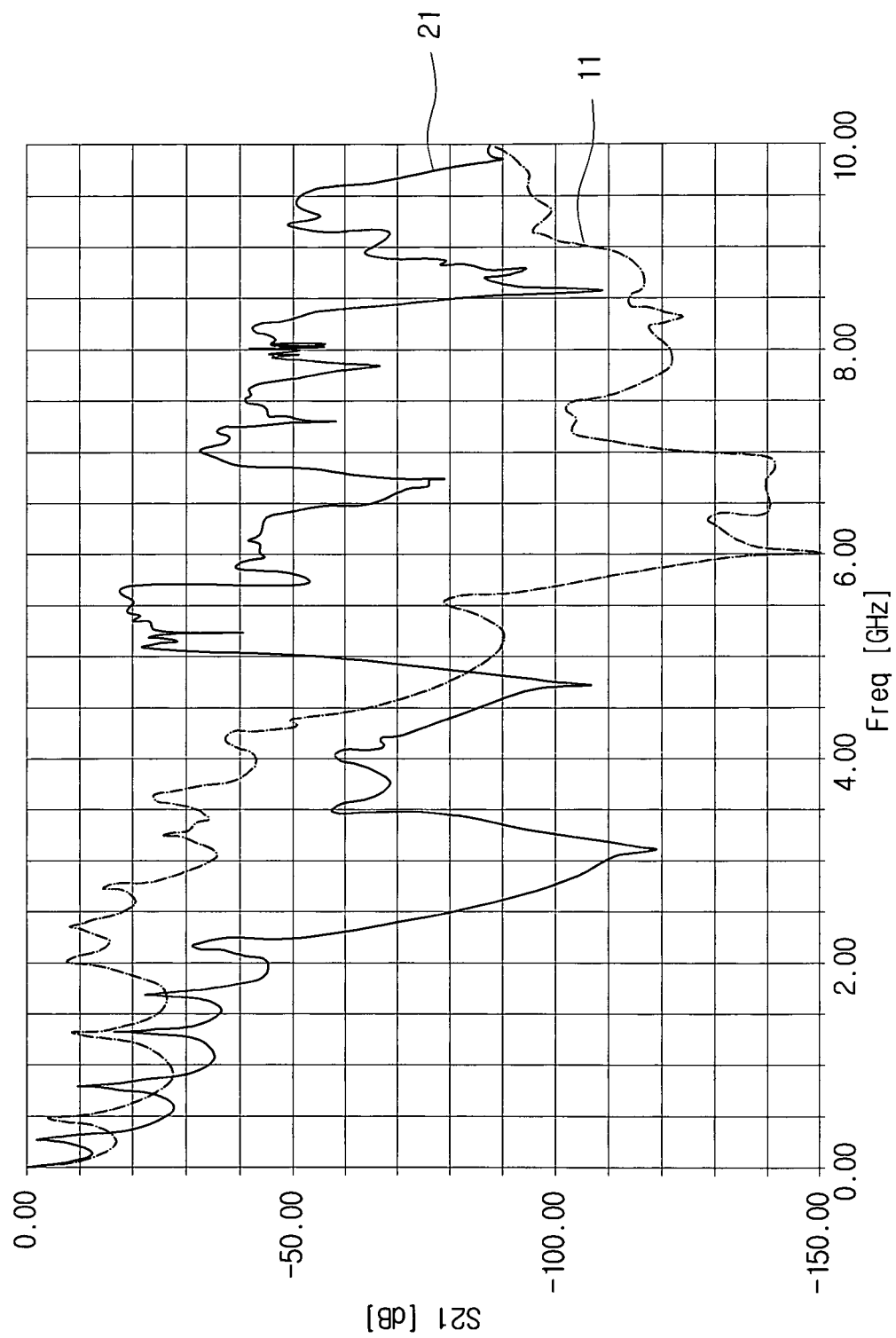
FIG. 7C shows each result graph simulated when the example models of FIG. 7A and FIG. 7B are applied.

FIG. 7A and FIG. 7B show example models for checking noise blocking possibility of an electromagnetic bandgap structure in accordance with an embodiment of the present invention, and FIG. 7C shows each result graph simulated when the example models of FIG. 7A and FIG. 7B are applied. Particularly, FIG. 7A shows an extension pattern 343 of the example model, and FIG. 7B shows extension patterns 344 and 345.

FIG. 7C shows frequency property graphs 11 and 21. The graph 21 indicates the frequency property of the electromagnetic bandgap structure that includes an extension pattern as well as the stitching via according to the present invention. The graph 11 indicates the frequency property of a comparison object electromagnetic bandgap structure which has the same design conditions as the electromagnetic bandgap structure including an extension pattern as well as the stitching via but does not include the extension pattern.

As shown in FIG. 7C, it can be recognized that the electromagnetic bandgap structure of the present invention has the bandgap frequency band of between about 2.3 and 5 GHz on a blocking rate −50 dB basis. However, the comparison object electromagnetic bandgap structure has the lower limitation frequency of about 4.3 GHz on the blocking rate −50 dB basis.

This result shows that the lower limitation value of the bandgap frequency decreased as the reason that the electromagnetic bandgap structure of the present invention could acquire a larger inductance value than the comparison object electromagnetic bandgap structure by the extension pattern of the stitching via.

Although the simulation result of FIG. 7 shows that the bandgap frequency band of the present invention ranges between about 2.3 and 5 GHz, the bandgap frequency band can be varied according to the change of design values such as the shape, length, area and width of the first via, the second via, the connection pattern and the extension pattern, which constitute the stitching via 340. In addition, it shall be obvious that the bandgap frequency and its blocking rate can be varied according to the change of design values such as the size, area and shape of the metal plate and the dielectric constant of a dielectric material forming the dielectric layer.

As described above, the present invention can block an electromagnetic wave of a desired frequency band by using an electromagnetic bandgap structure including a stitching via, a length of which is extended through an extension pattern. It can be easily understood that the present invention can also improve the design limitation and configuration difficulty when the electromagnetic bandgap structure is designed or arranged in a printed circuit board and have a lot of advantages for signal integrity.

Although some embodiments of the present invention have been described, anyone of ordinary skill in the art to which the invention pertains should be able to understand that a very large number of permutations are possible without departing the spirit and scope of the present invention and its equivalents, which shall only be defined by the claims appended below.

What is claimed is:

1. An electromagnetic bandgap structure comprising:
a dielectric layer;
a plurality of conductive plates;
a conductive layer; and
a plurality of stitching vias connecting conductive plates that are adjacent to each other,
each stitching via comprising:
a first via, passing through the dielectric layer and having an end part being placed on a same planar surface as one of two conductive plates,
a second via, passing through the dielectric layer and having an end part being placed on a same planar surface as the other of the two conductive plates,
a connection pattern, having one end part being connected to the other end part of the first via and the other end part being connected to the other end part of the second via, the first via and the second via being serially connected through the connection pattern, and
a first extension pattern, placed on a same planar surface as the one of the two conductive plates and having one end part being connected to the one end part of the first via and the other end part being connected to the one of the two conductive plates, wherein the dielectric layer is placed between the conductive plates and the conductive layer, the conductive layer comprises a clearance hole, and the connection pattern is accommodated in the clearance hole, the stitching via further comprises a second extension pattern, placed on a same planar surface as the other of the two conductive plates and having one end part being connected to the one end part of the second via and the other end part being connected to the other of the two conductive plates, and each of the conductive plates, with the exception of the conductive plates that are not placed in outermost areas of the two-dimensionally arranged conductive plates, are respectively connected with at least three of the stitching vias connecting adjacent conductive plates among the conductive plates arranged two-dimensionally on a same planar surface.

2. The electromagnetic bandgap structure of claim 1, wherein the conductive plates are placed on a same planar surface.

3. The electromagnetic bandgap structure of claim 1, wherein the conductive plates have a same size.

4. The electromagnetic bandgap structure of claim 1, wherein the conductive plates are distinguished into a plurality of groups having different conductive plate sizes.

5. The electromagnetic bandgap structure of claim 1, wherein the conductive plates each have a polygonal, circular or elliptical shape.

6. A printed circuit board, comprising:
an electromagnetic bandgap structure, configured to include a dielectric layer, a plurality of conductive plates, a conductive layer, and a plurality of stitching via connecting conductive plates that are adjacent to each other and arranged at an area of a noise transferable path between a noise source point and a noise blocking destination point of the printed circuit board,
each stitching via comprising
a first via, passing through the dielectric layer and having an end part being placed on a same planar surface as one of two conductive plates,
a second via, passing through the dielectric layer and having an end part being placed on a same planar surface as the other of the two conductive plates,
a connection pattern, having one end part being connected to the other end part of the first via and the other end part being connected to the other end part of the second via, the first via and the second via being serially connected through the connection pattern, and
a first extension pattern, placed on the same planar surface as the one of the two conductive plates and having one end part being connected to the one end part of the first via and the other end part being connected to the one of the two conductive plates, wherein the dielectric layer is placed between the conductive plates and the conductive layer, the conductive layer comprises a clearance hole, and the connection pattern is accommodated in the clearance hole, each stitching via further comprises a second extension pattern, placed on a same planar surface as the other of the two conductive plates and having one end part being connected to the one end part of the second via and the other end part being connected to the other of the two conductive plates, and each of the conductive plates, with the exception of the conductive plates that are not placed in outermost areas of the two-dimensionally arranged conductive plates, are respectively connected with at least three of the stitching vias connecting adjacent conductive plates among the conductive plates arranged two-dimensionally on a same planar surface.

7. The printed circuit board of claim 6, wherein the conductive layer is one of a ground layer and a power layer, and the conductive plates are electrically connected to the other.

8. The printed circuit board of claim 6, wherein the conductive layer is a ground layer, and the conductive plates are electrically connected to a signal layer.

9. The printed circuit board of claim 6, wherein two electronic circuits having different operation frequencies are implemented in the printed circuit board, and the noise resource point and the noise blocking destination point correspond to one position and another position, respectively, in which the two electric circuits are to be implemented.

10. The printed circuit board of claim 6, wherein the conductive plates are placed on a same planar surface.

11. The printed circuit board of claim 6, wherein the conductive plates have a same size.

12. The printed circuit board of claim 6, wherein the conductive plates are distinguished into a plurality of groups having different conductive plate sizes.

13. The printed circuit board of claim 6, wherein the conductive plates each have a polygonal, circular or elliptical shape.

* * * * *

UNITED STATES PATENT AND TRADEMARK OFFICE
CERTIFICATE OF CORRECTION

PATENT NO. : 8,420,949 B2  
APPLICATION NO. : 12/230871  
DATED : April 16, 2013  
INVENTOR(S) : Mi-Ja Han et al.

Page 1 of 1

It is certified that error appears in the above-identified patent and that said Letters Patent is hereby corrected as shown below:

Title Page Col. 1, After the Prior Application Data, insert -- (30) Foreign Application Priority Data
Dec. 7, 2007 (KR) 10-2007-0126760
June 18, 2008 (KR) 10-2008-0057443 --.

In the Claims
Column 14, Line 39, Claim 6, delete "via" and insert -- vias --, therefor.

Signed and Sealed this
Seventeenth Day of September, 2013

Teresa Stanek Rea
*Deputy Director of the United States Patent and Trademark Office*